United States Patent [19]

Mahler

[11] Patent Number: 5,350,455
[45] Date of Patent: Sep. 27, 1994

[54] DEVICE FOR HOLDING DISK-SHAPED SUBSTRATES IN THE VACUUM CHAMBER OF A COATING OR ETCHING APPARATUS

[75] Inventor: Peter Mahler, Hainburg, Fed. Rep. of Germany

[73] Assignee: Leybold Aktiengesellschaft, Hanau, Fed. Rep. of Germany

[21] Appl. No.: 160,927

[22] Filed: Dec. 1, 1993

[30] Foreign Application Priority Data

Feb. 25, 1993 [DE] Fed. Rep. of Germany ....... 4305749

[51] Int. Cl.[5] ............................................. C23C 16/00
[52] U.S. Cl. .................................. 118/728; 118/730; 118/503
[58] Field of Search ................ 118/728, 729, 730, 503

[56] References Cited

U.S. PATENT DOCUMENTS

| 4,535,835 | 8/1985 | Holden | 118/728 |
| 4,796,562 | 1/1989 | Brors | 118/728 |
| 4,823,736 | 4/1989 | Post | 118/728 |
| 5,138,974 | 8/1992 | Ciparisso | 118/731 |

FOREIGN PATENT DOCUMENTS 0143698 1/1984 European Pat. Off. .

*Primary Examiner*—Richard Bueker
*Attorney, Agent, or Firm*—Felfe & Lynch

[57] ABSTRACT

A flat rectangular substrate bed (3) having opposed parallel endwalls (14) and parallel sidewalls (16) receives a pair of clamping jaws (4) each having an L-shaped cross-section with a short limb against each sidewall and a long limb extending halfway over the top surface of the substrate bed. The long limbs (6) have arcuate recesses (7) which cooperate to surround the substrates (2) and thereby center and hold them. The two clamping jaws (4) are held by end bars (11) which are tightly joined to the substrate bed (3) by means of pins (10) and (12) received in respective bores (9) in the jaws and (13) in the endwalls.

7 Claims, 3 Drawing Sheets

DEVICE FOR HOLDING DISK-SHAPED SUBSTRATES IN THE VACUUM CHAMBER OF A COATING OR ETCHING APPARATUS

BACKGROUND OF THE INVENTION

The invention relates to a device for holding disk-shaped substrates in the vacuum chamber of a coating or etching apparatus, having a planar substrate bed with a preferably rectangular plan, especially for fastening to a rotatable structure. A suitable rotatable structure is disclosed in U.S. patent application No. 160,923 filed concurrently herewith.

In practice it has proven to be problematical to arrange thin substrates of fragile material, such as wafers, on the substrate holder so that they will not slip off when the substrate holder is rotated to a vertical position. Also, it has proven to be difficult to assure sufficient cooling of the substrates when they are so thin that even very slight clamping forces result in a flexing of the substrate, so that the substrates no longer lie with their full surface against, for example, a water-cooled substrate bed.

SUMMARY OF THE INVENTION

The substrate bed, with a preferably rectangular base surface, especially for fastening to a rotating means, is provided with clamping jaws with an L-shaped cross section parallel to the two long lateral sidewalls and partially overlapping the top surface of the substrate bed. The jaws have limbs lying on the upper surface of the substrate bed, which limbs have arcuate recesses facing one another to encircle the substrates placed on the upper surface of the substrate bed. The two clamping jaws have a bore on each of their narrow end faces which receives a first pin fixedly disposed on the corresponding end bar of a pair of end bars. The two end bars are provided with additional pins parallel to the first pair of pins, which cooperate with bores in the endwalls of the substrate bed.

Preferably, the flat substrate bed has on its upper surface a plurality of circular holding disks disposed in a row, whose bottom sides are fixedly joined to the substrate bed, and whose diameter corresponds to the diameter of the substrates. The arcuate recesses of the clamping jaw limbs lying on the upper surface of the substrate bed are matched to the marginal configuration of the holding disks and protrude slightly beyond the top surface of the holding disks in order to come into direct contact with the marginal portions of the substrates.

More expediently, a contact means is provided, e.g., an indium-gallium preparation, promoting heat transfer between the bottom of the substrate and the top of the associated holding disk.

DETAILED DESCRIPTION OF THE PREFERRED EMBODIMENT

Figure 1:
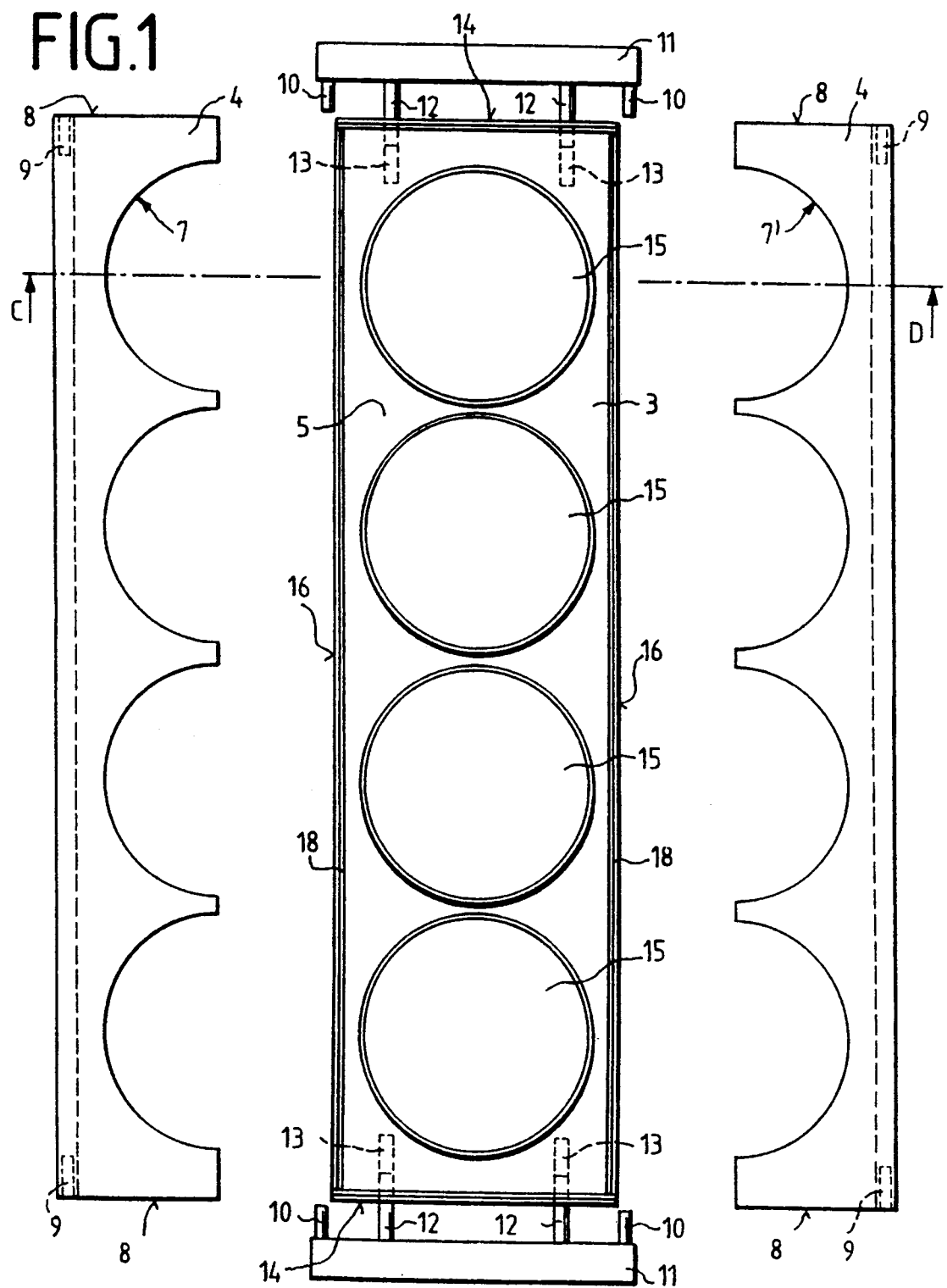
FIG. 1 is an exploded plan view of the substrate holder.
Figure 1A:
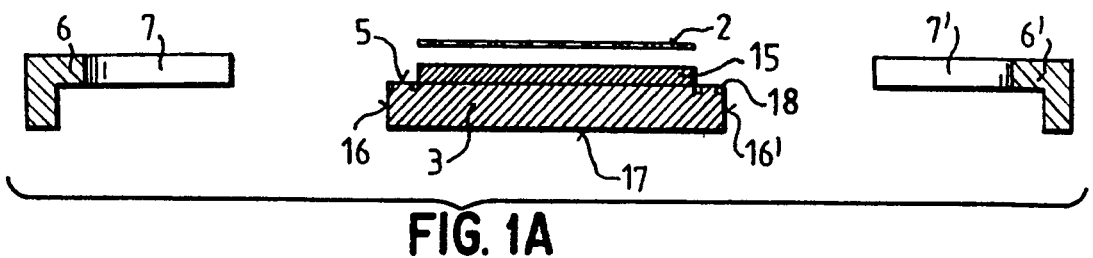
FIG. 1A is an exploded section view taken along the lines C-D of FIG. 1.
Figure 1B:
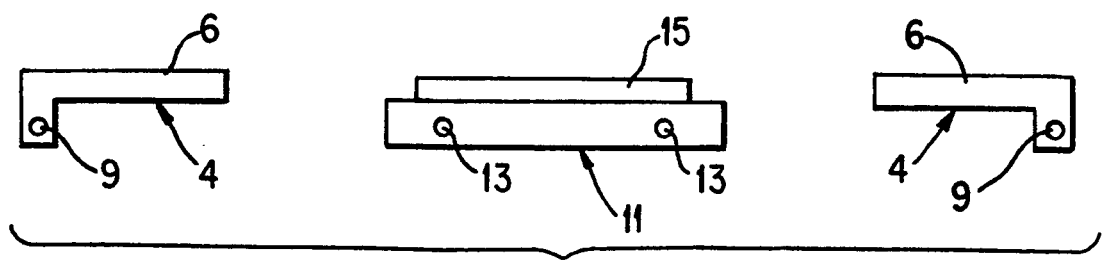
FIG. 1B is an exploded end view of the substrate bed and clamping jaws.

Referring to FIGS. 1 and 1A, the device consists of a flat substrate bed 3 of rectangular shape, having opposed endwalls 14, opposed sidewalls 16, and a top surface 5 on which a total of four holding disks 15 are fixed in a row, for example by soldered. Two clamping jaws 4 having an L-shaped profile each have a short limb fitted against a sidewall 16 and a long limb 6 extending halfway over surface 5 and having arcuate recesses 7 corresponding to the round edges of the holding disks 15. Two end bars 11 each have two pins 10 received in respective bores 9 in the clamping jaws 4, and two pins 12 received in respective bores 13 in the endwalls 14 of substrate bed 3.

The substrate bed 3 is furthermore provided in its top surface 5 with grooves 18 adjacent to endwalls 14 and sidewalls 16 to form a continuous circumferential gutter to accommodate excess heat transfer medium flowing down from the coating applied to the top of the holding disks 15 when the substrates 2 are laid on the holding disks 15. Such heat transfer medium may preferably be an indium-gallium preparation.

Figure 2:
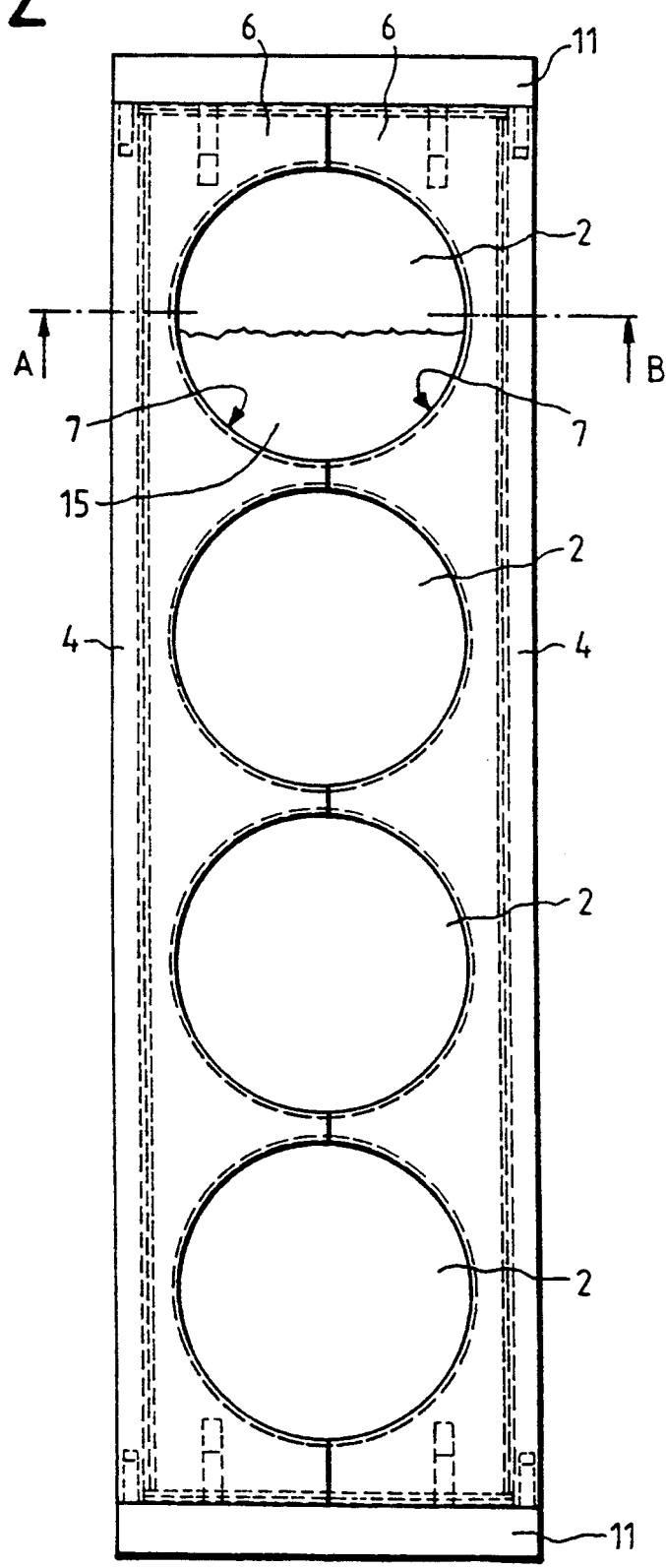
FIG. 2 is a plan view of the assembled substrate holder.
Figure 2A:
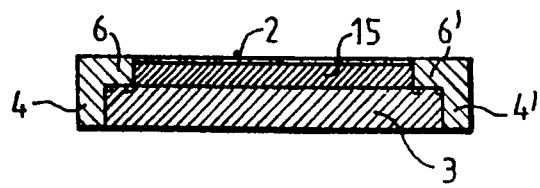
FIG. 2A is a section view of the assembled substrate holder.

Referring to FIGS. 2 and 2A, the individual substrates 2 which lie on the holding disks 15 are grasped on both sides by the arcuate recesses 7, the limbs 6 of the clamping jaws 4 projecting slightly beyond the upper surfaces of the substrates 2 and thus preventing them from sliding off laterally from the holding disks 15. The end bars 11 which rest with their pins or studs 10, and 12 in the respective bores 9 and 13 hold the clamping jaws 4 precisely and firmly on the flat substrate bed 3. The clamping jaws 4 are precisely machined so that the recesses 7 firmly contact the cylindrical surface of the holding disks 15 but on the other hand hold the substrates in place without introducing any significant stress.

I claim:

1. Apparatus for holding disk-shaped substrates, said apparatus comprising
   a flat rectangular substrate bed having a top surface, parallel opposed endwalls, and parallel opposed sidewalls,
   a pair of clamping jaws each having an L-shaped cross section with a short limb fitted against a respective sidewall, a long limb extending halfway over said top surface, and a pair of opposed ends, each said long limb having a plurality of semi-circular recesses which cooperate with respective said recesses of the other said limb to hold respective said substrates therebetween, and
   means for positioning said clamping jaws firmly with respect to said substrate bed.

2. Apparatus as in claim 1 wherein said means for positioning comprises
   a pair of end bars each fitted against an endwall of said substrate bed and an end of each said clamping jaw, and
   bore and pin means cooperating between each said end bar and a respective said endwall and pair of ends.

3. Apparatus as in claim 2 wherein said bore and pin means comprises four pins fixed to each said endwall, a pair of bores in each said endwall, and a bore in each said end, said ends being flush with said endwalls.

4. Apparatus as in claim 3 further comprising a like plurality of substrate holding disks fixed in a row to said top surface of said bed, each said holding disk being positioned to receive a pair of opposed arcuate recesses therearound.

5. Apparatus as in claim 4 wherein each said holding disk has a top surface to which a heat transfer medium has been applied.

6. Apparatus as in claim 5 wherein said heat transfer medium is an indium-gallium preparation.

7. Apparatus as in claim 5 wherein said top surface has groove means adjacent to each said sidewall and each said endwall.

* * * * *